(12) United States Patent  (10) Patent No.: US 7,710,184 B2
van der Goes et al.  (45) Date of Patent: May 4, 2010

(54) ISI REDUCTION TECHNIQUE

(75) Inventors: Franciscus Maria Leonardus van der Goes, Den Haag (NL); Jan Mulder, Bunnik (NL); Christopher Michael Ward, Bunnik (NL)

(73) Assignee: Broadcom Corporation, Irvine, CA (US)

( * ) Notice: Subject to any disclaimer, the term of this patent is extended or adjusted under 35 U.S.C. 154(b) by 59 days.

(21) Appl. No.: 11/523,694

(22) Filed: Sep. 20, 2006

(65) Prior Publication Data

US 2007/0182476 A1    Aug. 9, 2007

Related U.S. Application Data

(60) Provisional application No. 60/771,009, filed on Feb. 8, 2006.

(51) Int. Cl.
*H03K 5/00* (2006.01)
(52) U.S. Cl. ......................... 327/337; 327/554
(58) Field of Classification Search ............... 327/94, 327/554, 341, 337
See application file for complete search history.

(56) References Cited

U.S. PATENT DOCUMENTS 3,449,741 A * 6/1969 Egerton, Jr. .................. 341/108
3,633,197 A * 1/1972 Dunlap, III .................... 28/299
5,095,223 A * 3/1992 Thomas ....................... 307/110
5,359,294 A  10/1994 Ganger et al.
6,147,888 A * 11/2000 Rivet ........................... 363/143
6,198,645 B1 * 3/2001 Kotowski et al. .............. 363/59
6,562,958 B1  5/2003 Breton et al.
6,826,390 B1 * 11/2004 Tamura .................... 455/226.1
6,834,001 B2 * 12/2004 Myono ......................... 363/60
7,154,797 B1 * 12/2006 Saito et al. .................. 365/208

FOREIGN PATENT DOCUMENTS

DE            43 28 973 C1      8/1994

OTHER PUBLICATIONS

Tietze et al., "Hableiter-Schaltungstechnik", 1990, Springer Verlag, Berlin, p. 451.
Search Report for European Application No. 06022240.3-2215, completed May 21, 2007, 4 pgs.

* cited by examiner

*Primary Examiner*—Dinh T. Le
(74) *Attorney, Agent, or Firm*—Sterne, Kessler, Goldstein & Fox P.L.L.C.

(57) ABSTRACT

The invention refers to signal processing circuits, more particularly, to switch capacitor circuits, and methods for reducing inter-symbol-interference. A switch capacitor circuit with reduced Inter-Symbol-Interference effect is provided, comprising: a voltage source, a first capacitor, a second capacitor, and at least one switch configured to be switched in a way that the first capacitor is charged to a first voltage by means of the voltage source, and then discharged by means of the second capacitor, thereby reducing the Inter-Symbol-Interference effect.

10 Claims, 4 Drawing Sheets

ISI REDUCTION TECHNIQUE

CROSS-REFERENCE TO RELATED APPLICATIONS

This application claims benefit to U.S. Provisional Patent Application Ser. No. 60/771,009, filed Feb. 8, 2006, entitled "ISI Reduction Technique", which is incorporated by reference in its entirety.

BACKGROUND OF THE INVENTION

1. Field of the Invention

The present invention relates generally to signal processing circuits, and more specifically to a switch-capacitor circuit for reducing the Inter-Symbol-Interference (ISI) effect.

2. Background Art

Switch-Capacitor (SC) circuits are widely used in all kinds of signal processing circuits and are based on capacitors that are switched to signal voltages. Typically, the switching takes place at the beginning of every clock cycle. After the switching, the capacitor is charged to the signal voltage. This process takes some time and the speed of charging depends on the time constant involved.

At the same time the capacitor is being charged up to its new voltage, it is being discharged from the voltage it had at the end of the previous clock cycle.

Both the charging and discharging process can be described by the same time constant and therefore can have the same speed. Because the discharging is imperfect, some voltage from the previous clock cycle may remain. This phenomenon is called Inter-Symbol-Interference (ISI).

For most circuits, the accuracy that is required for the charging process is usually similar to the accuracy required for the discharging process. In such a case, ISI does not significantly limit the maximum clock frequency. However, there exist certain types of circuits which do not require a high level of accuracy for charging, but still require a high level of accuracy for discharging. In such cases, ISI does limit the maximum clock frequency. Thus, if the ISI problem could be reduced in these types of circuits, the maximum clock frequency of such circuits could be increased. For example, a SubRange ADC consisting of a Coarse and Fine ADC is a circuit affected by ISI. Here, ISI leads to errors in the decision of both the Coarse and Fine decision.

Referring now to FIG. 1, there is shown a simple prior art switch-capacitor circuit 100 having a voltage source 102 having a variable voltage output Vin, an output resistance 104, a capacitor 106, and switches, 108a, 108b, and 108c, that are operated during non-overlapping clock phases phi(1) (switches 108a, 108b) and phi(2) (switch 108c). Vin may be the output voltage of a circuit, such as a Track-Hold (TH) amplifier (not shown).

As can be seen from FIG. 1, the voltage source 102 is coupled to the switch 108a via a line 102a. The switch 108a is coupled to the capacitor 106 via a line 106a, and to the switch 108c via a line 106b. Further, the capacitor 106 is coupled to the switch 108b via a line 106c. As is further shown in FIG. 1, the voltage source 102 is coupled to the switch 108c via a line 102b, and a line 102c, and to the switch 108b via the line 102b, and a line 102d.

During clock phase phi(1), the capacitor 106 is charged to Vin through resistance 104. During the same time interval, capacitor 106 is also being discharged through resistance 104. The effect of discharging of the previous voltage across the capacitor 106 is clearly visible in the nodal voltage Va. At the beginning of phi(1), Va starts at the previous value of Vin. Because Va is not equal to Vin at the end of phi(1), Vb during phi(2) is also not equal to Vin during phi(1). Thus, both voltages Va and Vb are not ideal.

Some circuits are negatively impacted by the non-ideal behavior of Va and others more by the non-ideal behavior of Vb. For example, a SubRange ADC with a Coarse and Fine ADC is negatively affected by the non-ideal behavior of Va. The ISI kick comes from the Fine ADC (modeled by the capacitor C). The Coarse ADC is also connected to node a during phi(1). The amplifiers inside the Coarse ADC amplify Va. The outputs of these amplifiers are highly distorted because of the ISI kick and this has a negative impact on the Coarse-Fine timing of the SubRange ADC. An example of a circuit that is sensitive to the non-ideal behavior of Vb is the Fine ADC of a SubRange ADC. When Vb differs too much from Vin, distortion inside the ADC occurs. Thus, what is needed is an improved switch-capacitor circuit that improves the non-ideal behavior of Va and Vb.

One method for reducing the ISI effect is to increase the bandwidth of the circuits. However, because this solution also increases current consumption, it is neither an attractive nor practical solution.

Another method for reducing ISI is based on shorting the capacitor 106 for a short amount of time. Referring now to FIG. 2, there is shown a switch-capacitor circuit in which ISI cancellation is achieved by shorting the capacitor (here: a capacitor 206). Corresponding to the switch-capacitor circuit 100 shown in FIG. 1, the switch-capacitor circuit 200 shown in FIG. 2 comprises a voltage source 202 having a variable voltage output Vin, an output resistance 204, a capacitor 206, and switches, 208a, 208b, and 208c, that are operated during non-overlapping clock phases phi(1) (switches 208a, 208b) and phi(2) (switch 208c). Further, the switch-capacitor circuit 200 comprises a switch 208d for shorting the capacitor 206.

As can be seen from FIG. 2, the voltage source 202 is coupled to the switch 208a via a line 202a. The switch 208a is coupled to the capacitor 206 via a line 206a, and to the switch 208c via a line 206b. Further, the capacitor 206 is coupled to the switch 208b via a line 206c. As is further shown in FIG. 2, the voltage source 202 is coupled to the switch 208c via a line 202b, and a line 202c, and to the switch 208b via the line 202b, and a line 202d. In addition, the switch 208d is coupled to the capacitor 206 (and to the switches 208a, 208c) via a line 208e, and to the capacitor 206 (and to the switch 208b) via a line 208f.

The above shorting of the capacitor 206 by the switch 208d is illustrated by switch phi(3) at the beginning of the clock cycle phi(1). Although this solution is relatively simple to implement, this technique has several disadvantages. One disadvantage is that the output terminal of the amplifier is temporarily shorted which creates huge current spikes in the amplifier. Another disadvantage is that the time to charge the capacitor 206 up to Vin (during phi(1)) effectively becomes shorter since no charging is possible during phi(3). The charging of the capacitor 206 begins after phi(3). As a result, the maximum clock frequency of the circuit effectively decreases depending on the duration of phi(3).

Therefore, what is needed is a new technique and circuit that reduces the ISI effect without the problems encountered in the prior art.

BRIEF SUMMARY OF THE INVENTION

The present invention comprises a method and a system, such as a switch-capacitor circuit, substantially as shown in and/or described in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

The present invention generally pertains to a technique and circuit configuration for reducing the Inter-Symbol-Interference (ISI) effect in a switch capacitor circuit.

Figure 3:
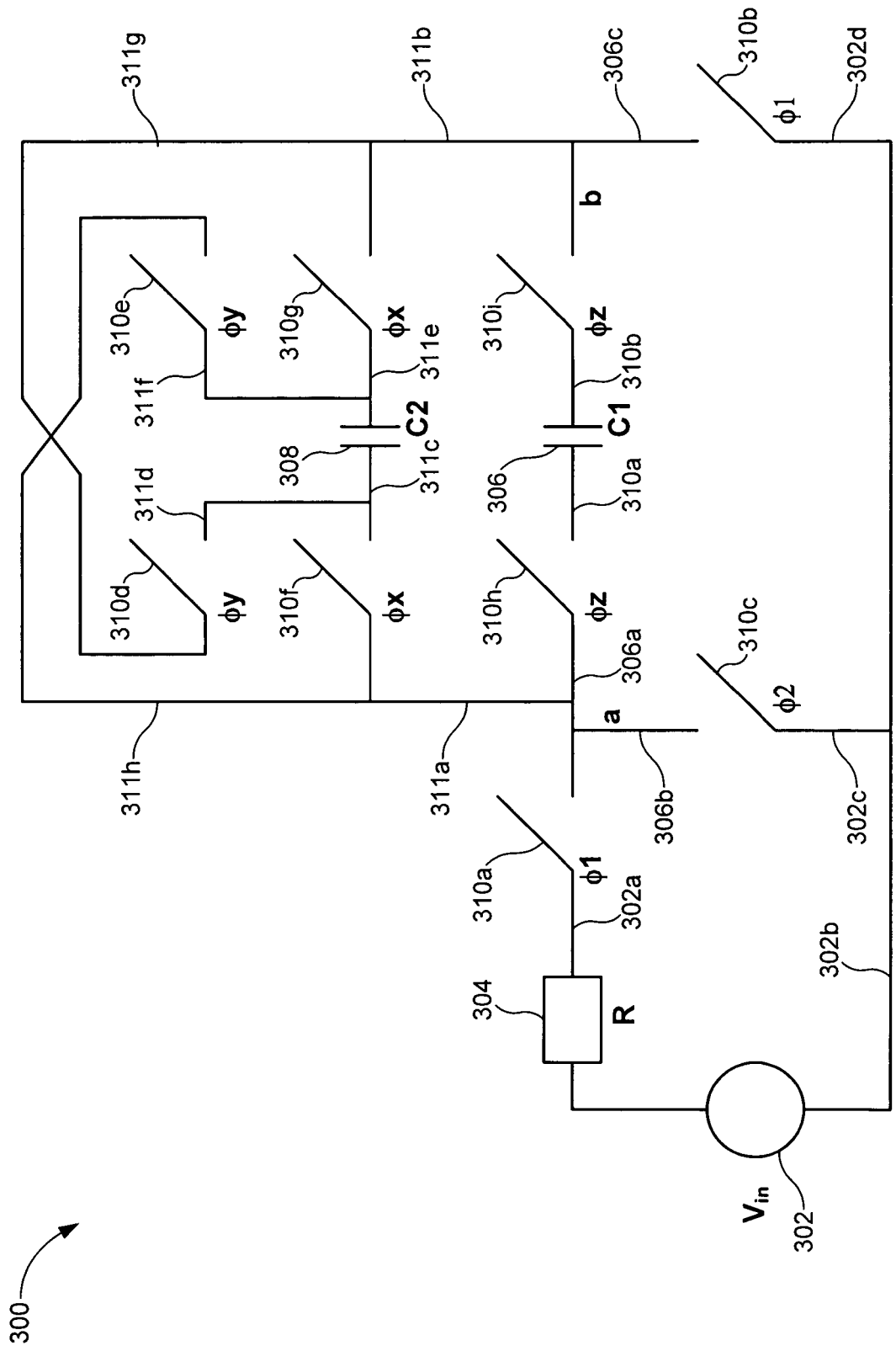
FIG. 3 illustrates a switch-capacitor circuit in accordance with one embodiment of the present invention.

Referring now to FIG. 3, there is shown a switch-capacitor circuit 300 in accordance with one embodiment of the present invention. The switch-capacitor circuit 300 comprises a voltage source 302, an output resistance 304, switches 310a, 310b, 310c, 310d, 310e, 310f, 310g, 310h, 310i, and capacitors 306, 308.

Capacitor 306 is connectable with the voltage source 302 and the output resistance 304. Capacitor 308 can be connected to the capacitor 306 in parallel through switches 310f,g and anti-parallel through switches 310d,e.

In further detail, as is shown in FIG. 3, the voltage source 302 is coupled to the switch 310a via a line 302a. The switch 310a is coupled to the switch 310h via a line 306a, and to the switch 310c via a line 306b. Further, the switch 310h is coupled to the capacitor 306 via a line 310a. Further, the capacitor 306 is coupled to the switch 310i via a line 310b. The switch 310i is coupled to the switch 310b via a line 306c. As is further shown in FIG. 3, the voltage source 302 is coupled to the switch 310c via a line 302b, and a line 302c, and to the switch 310b via the line 302b, and a line 302d.

In addition, the switch 310f is coupled to the switch 310h (and to the switches 310a, 310c) via a line 311a. Further, the switch 310g is coupled to the switch 310i (and to the switch 310b) via a line 311b.

As is shown in FIG. 3, the switch 310f is coupled to the capacitor 308 via a line 311c, and to the switch 310d via a line 311d.

Correspondingly, the switch 310g is coupled to the capacitor 308 via a line 311e, and to the switch 310e via a line 311f.

Still further, the switch 310d is coupled to the switch 310i (and to the switches 310b, 310g) via a line 311g (and the line 311b, etc.).

Correspondingly, the switch 310e is coupled to the switch 310h (and to the switches 310c, 310a, 310f) via a line 311h (and the line 311a, etc.).

Figure 1:
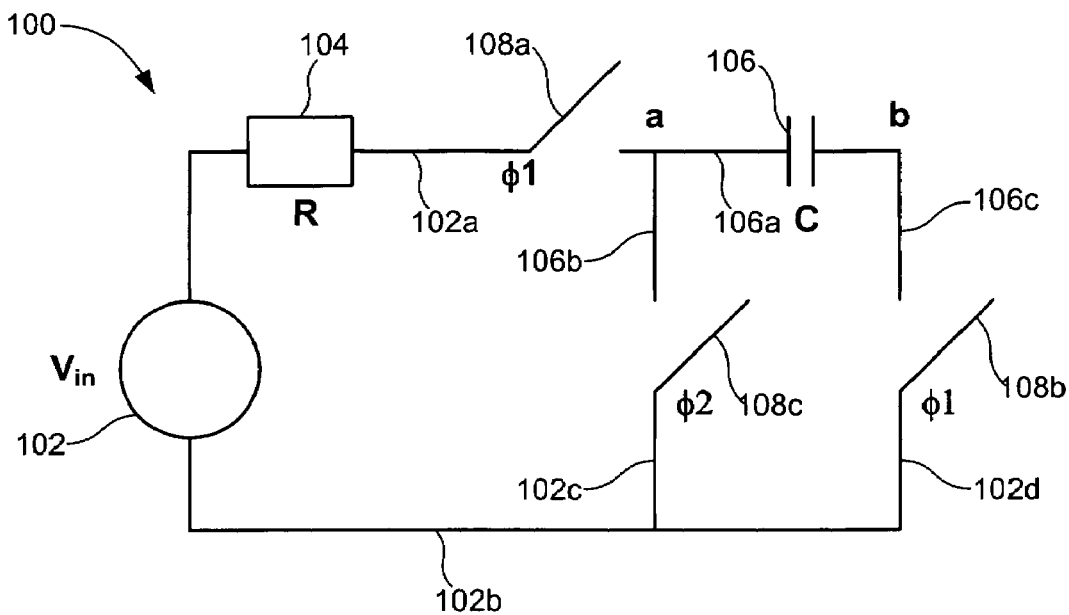
FIG. 1 illustrates a simple prior art switch-capacitor circuit with timing and voltages.
Figure 1:
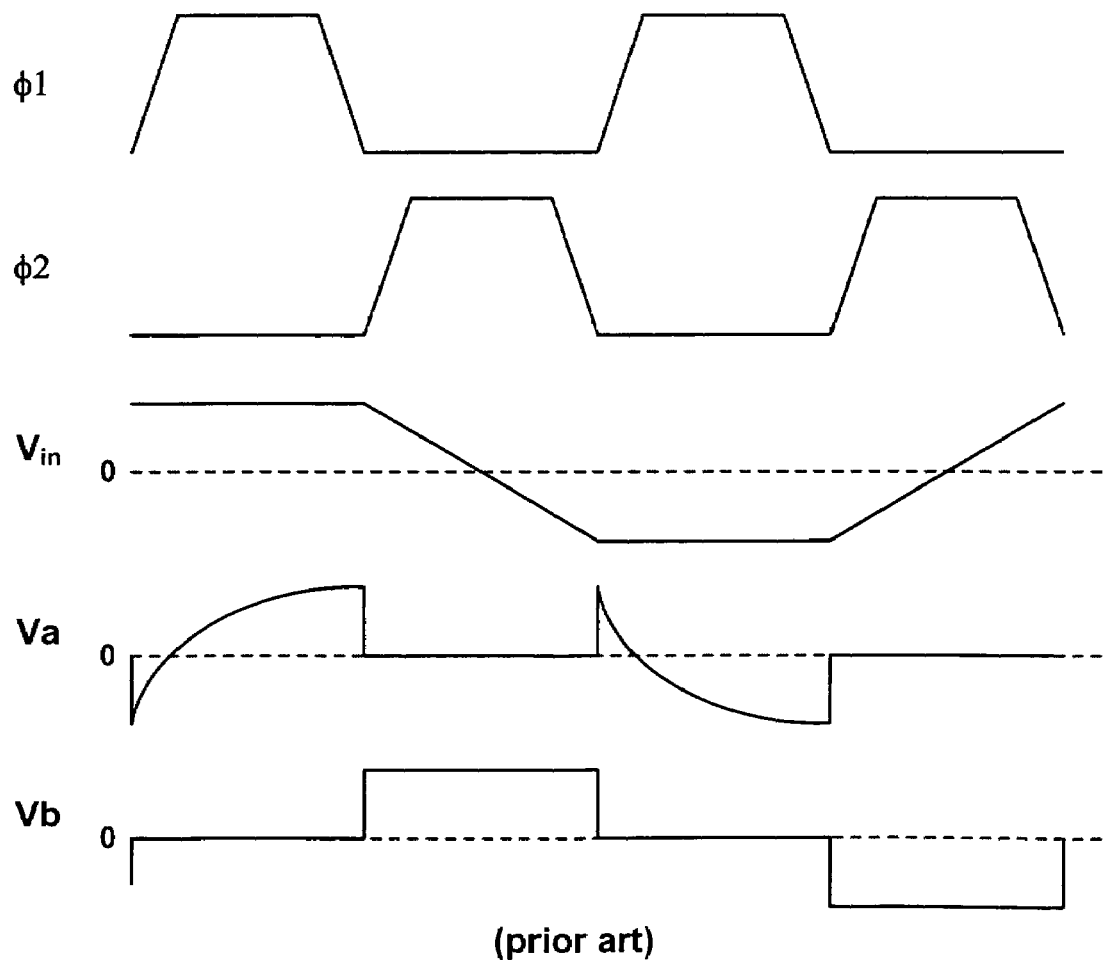
Figure 2:
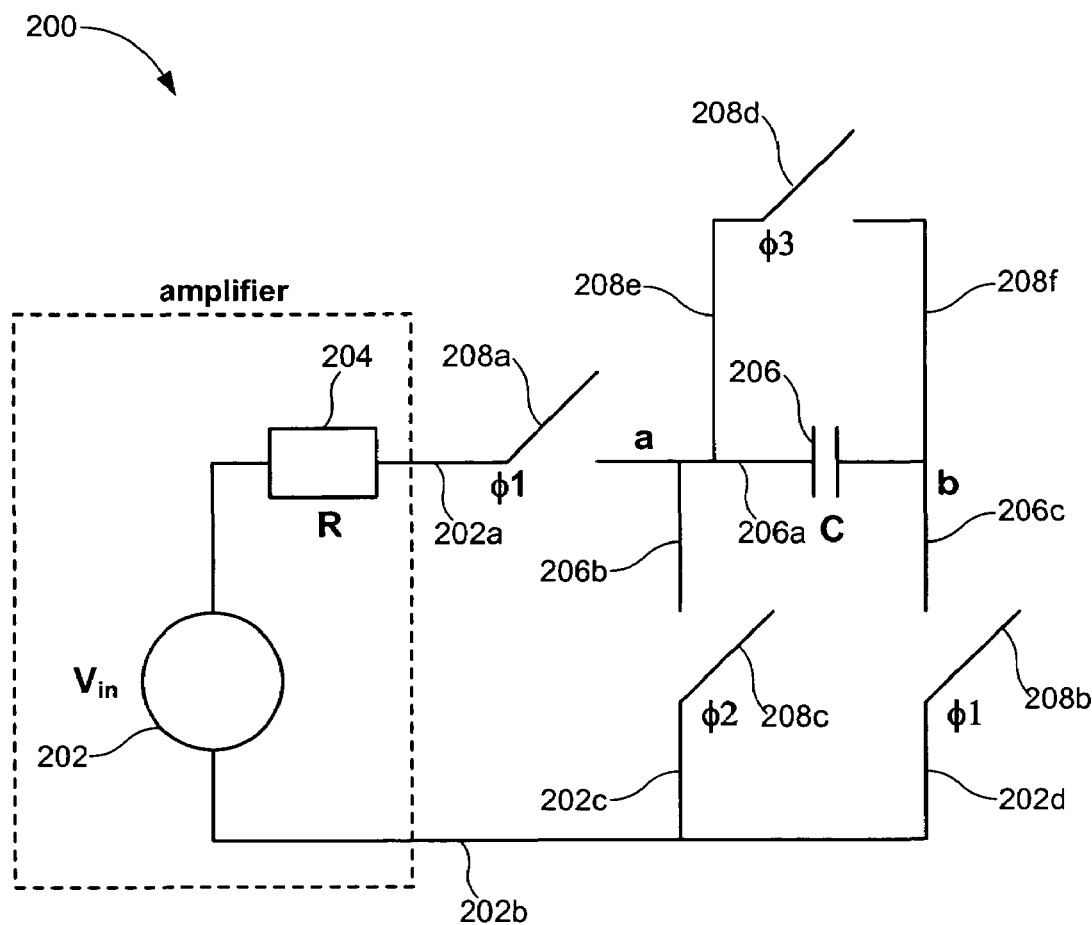
FIG. 2 illustrates another prior art switch-capacitor circuit.
Figure 2:
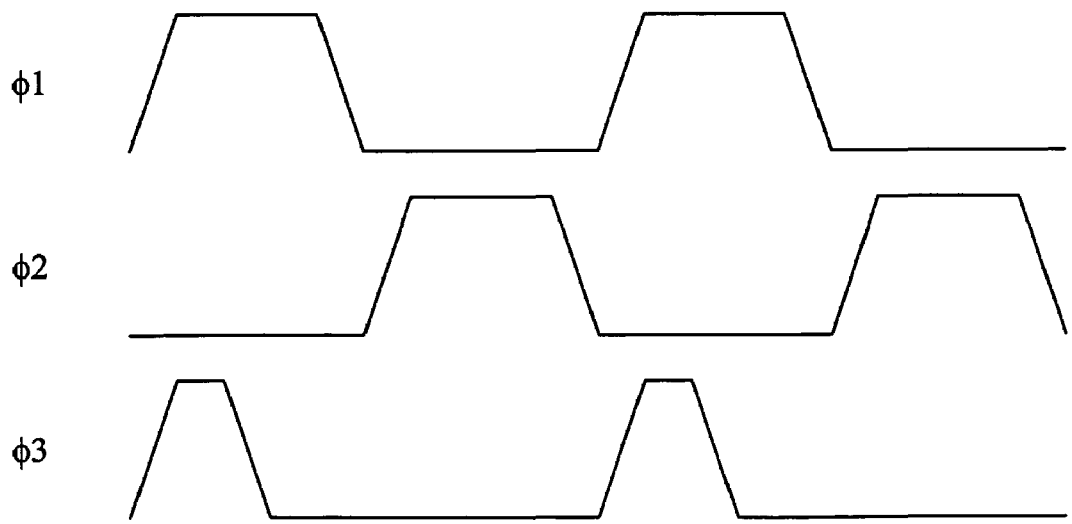

Switches 310a, 310b, 310c are operated in a way analogous to the prior art switch-capacitor circuit 100 of FIG. 1 (in particular, the corresponding switches 108a, 108b, 108c), that is to say they are operated during non-overlapping clock-phases phi(1) (switches 310a, 310b) and phi(2) (switch 310c) (see FIG. 1).

Switch-capacitor circuit 300 splits the capacitor (e.g., the capacitor 106) from the prior art switch capacitor circuit 100 into two equal parts, capacitor 306, and capacitor 308 (i.e., two capacitors 306, 308 of the same capacitance), and connects capacitor 308, to non-overlapping clock-phases phi(x) (switches 310f,g) and phi(y) (switches 310e,d) (i.e., electrically couples the capacitor 308 during the clock-phase phi(x) to the lines 311a, 311b via the switches 310f, 310g (but not via the switches 310d, 310e), and electrically couples the capacitor 308 during the clock-phase phi(y) to the lines 311a, 311b via the switches 310d, 310e (but not via the switches 310f, 310g, i.e., inversely as during the clock-phase phi(x))). The operation frequency of these switches (switches 310f,g, and switches 310e,d) is half that of phi(1) and phi(2).

For reasons of symmetry, capacitor 306, may be connected by switches 310h,i to the circuit 300. These switches can be always left on or be operated on phi(x) or phi(y).

At the beginning of phi(1) the switches 310f,g, in series with capacitor 308, are also being operated (beginning of phi(x)), but not the switches 310d, 310e. Therefore, the capacitors 306 and 308 are both charged to a first voltage V1.

During phi(2), the voltage V1 existing across capacitors 306 and 308 remains constant, since both capacitors 306 and 308 are disconnected from the voltage source 302 and the resistance 304, while the voltage source 302 changes its output voltage without any impact on the capacitors 306 and 308 during phi(2) being disconnected from these.

Then, at a new beginning of phi(1), the switches 310d and 310e are also being operated (beginning of phi(y)), but not the switches 310f and 310g, thus applying an anti-parallel connection between the capacitors 306 and 308. Consequently, the voltage V1 still existing across capacitor 306, is compensated by an equal voltage V2 existing across capacitor 308, which is opposite in sign. The net voltage is zero, which means a total discharge. This discharge path does not go through resistance 304, but goes from capacitor 306 to capacitor 308, and is therefore very fast.

As, during phi(1), the capacitors 306 and 308 being connected anti-parallel are now connected with the voltage source 302, which has changed its output voltage during the last phi(2), the capacitors 306 and 308 are charged with a third voltage V3 and a fourth voltage V4, respectively, wherein the voltages V3 and V4 have the same absolute value, but are opposite in sign.

During phi(2), the voltages V3 and V4 existing across capacitors 306 and 308, respectively, remain constant, since both capacitors 306 and 308 are disconnected from the voltage source 302 and the resistance 304, while the voltage source 302 changes its output voltage without any impact on the capacitors 306 and 308 during phi(2) being disconnected from these.

Then, at a further new beginning of phi(1) the switches 310f,g, in series with capacitor 308, are also being operated (beginning of phi(x)), but not the switches 310d, 310e, and the capacitors are now connected in parallel again. Consequently, the voltage V3 still existing across capacitor 306, is compensated by an the voltage V4 existing across capacitor 308. The net voltage is zero, which means a total discharge. The discharge path goes from capacitor 306 to capacitor 308, and is therefore very fast.

At this point, a full cycle has been carried out and the process described above starts anew.

Summarizing, the charge compensation in the circuit 300 is obtained by flipping the capacitor 308, with respect to capacitor 306, and applying an anti-parallel connection.

Typically, capacitors do not have a symmetrical layout, but one terminal of a capacitor is shielding the other terminal from unwanted electric fields. The shield prevents unwanted electric fields to enter the shielded terminal. The shielding terminal should be used as the transmitter and this terminal is always connected to a fixed voltage (either through a switch or through a resistor). The terminal that is shielded should be used as the receiver and this terminal is sometimes floating. A floating terminal is sensitive to unwanted electric fields and therefore it needs to be shielded.

When the capacitor 308 is flipped and anti-parallel connected, the transmitter becomes the receiver while it still "sees" unwanted electric fields. This now becomes an issue, since this node is floating.

Figure 4:
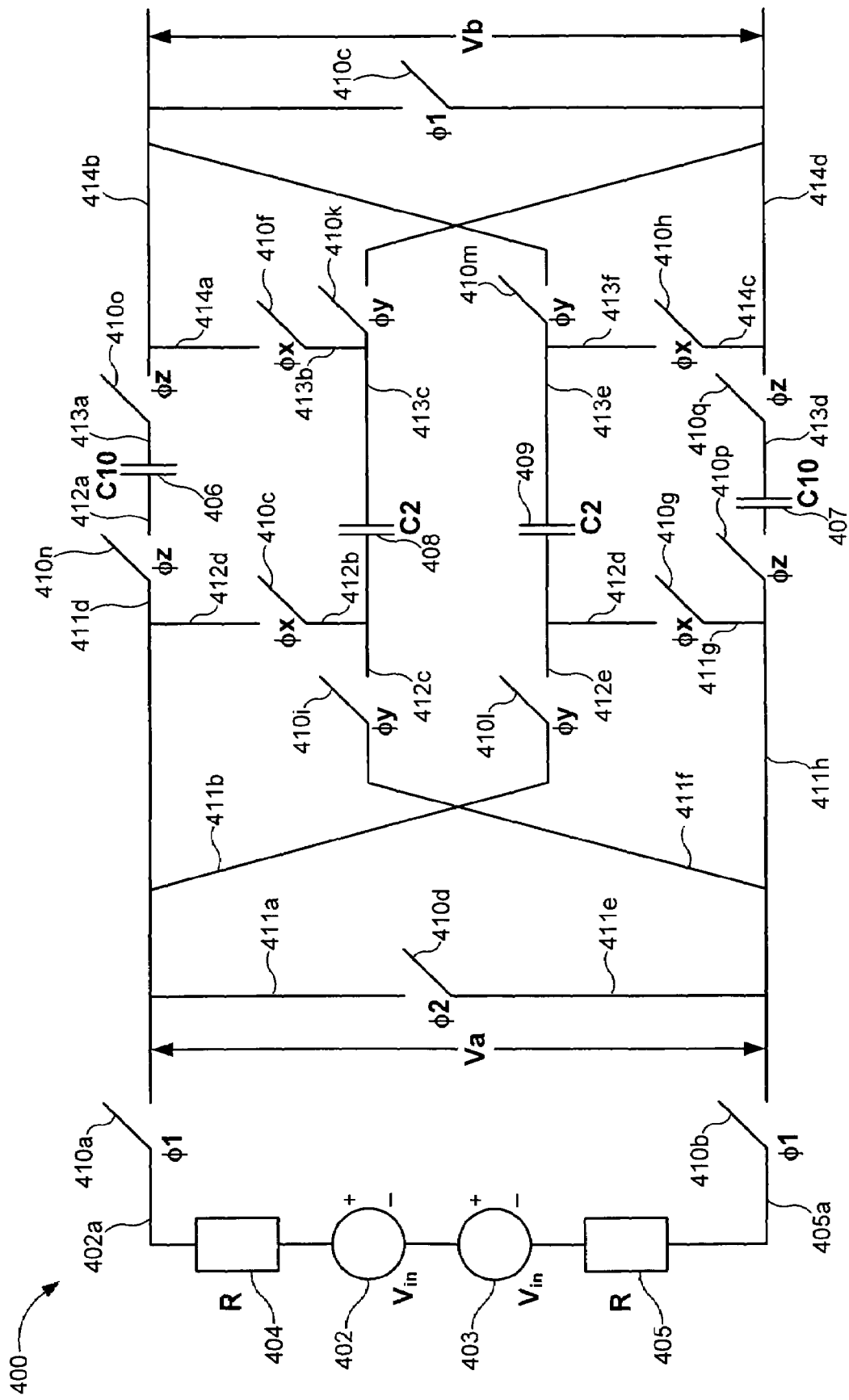
FIG. 4 illustrates another switch-capacitor circuit in accordance with another embodiment of the present invention.

Referring now to FIG. 4, there is shown another switch-capacitor circuit 400 in accordance with another embodiment of the present invention. The switch-capacitor circuit 400 of FIG. 4 cancels the ISI while the shielded terminal is always the receiver.

The switch-capacitor circuit 400 comprises voltage sources 402, 403, output resistances 404, 405, capacitors 406, 407, 408, 409 and switches 410a, 410b, 410c, 410d, 410e, 410f, 410g, 410h, 410i, 410k, 410l, 410m, 410n, 410o, 410p, 410q.

The circuit is based on differential signals and also on split capacitors, similar as in the embodiment shown in FIG. 3, but switch-capacitor circuit 400 further splits capacitors 306 and 308 of FIG. 3 into capacitors 406, 407 and into capacitors 408, 409, respectively. The capacitors 406-409 all have the same capacitance.

The capacitor 406 is connectable to the voltage source 402 and output resistance 404 and the capacitor 407 is connectable to the voltage source 403 and the output resistance 405. Capacitor 408 can be connected in parallel to capacitor 406 through switches 410e,f and can also be connected in parallel to capacitor 407 through switches 410i,k. Capacitor 409 can be connected in parallel to capacitor 407 through switches 410g,h and can also be connected in parallel to capacitor 406 through switches 410l,m.

In further detail, as is shown in FIG. 4, the voltage source 404 is coupled to the switch 410a via a line 402a, and the voltage source 405 is coupled to the switch 410b via a line 405a.

The switch 410a is coupled to the switch 410d via a line 411a, to the switch 410l via a line 411b, to the switch 410e via a line 411c, and to the switch 410n via a line 411d.

Further, the switch 410b is coupled to the switch 410d via a line 411e, to the switch 410i via a line 411f, to the switch 410g via a line 411g, and to the switch 410p via a line 411h.

The switch 410n is coupled to the capacitor 406 via a line 412a. In addition, the capacitor 408 is coupled to the switch 410e via a line 412b, and to the switch 410i via a line 412c.

Further, the switch 410p is coupled to the capacitor 407 via a line 412d. In addition, the capacitor 409 is coupled to the switch 410g via a line 412d, and to the switch 410l via a line 412e.

Still further, the capacitor 406 is coupled to the switch 410o via a line 413a, and the capacitor 408 is coupled to the switch 410f via a line 413b, and to the switch 410k via a line 413c.

The capacitor 407 is coupled to the switch 410q via a line 413d, and the capacitor 409 is coupled to the switch 410m via a line 413e, and to the switch 410h via a line 413f.

As can be further seen in FIG. 4, the switch 410o is coupled to the switch 410f via a line 414a, and to the switch 410c and the switch 410m via a line 414b.

Correspondingly, the switch 410q is coupled to the switch 410h via a line 414c, and to the switch 410c and the switch 410k via a line 414d.

Switches 410a-d are operated in a way analogous to the prior art switch-capacitor circuit 100 of FIG. 1 (in particular, the corresponding switches 108a, 108b (which correspond to switches 410a-c), and the switch 108c (which corresponds to switch 410d)), that is to say they are operated during non-overlapping clock-phases phi(1) (switches 410a-c) and phi (2) (switch 410d).

Switches 410e-m are operated during non-overlapping clock-phases phi(x) (switches 410e-h) and phi(y) (switches 410i-m). The operation frequency of these switches is half that of phi(1) and phi(2).

For reasons of symmetry, the capacitor 406 may be connected by switches 410n,o to the circuit 400, and the capacitor 407 may be connected by switches 410p,q to the circuit 400. These switches can be always left on or be operated on phi(x) or phi(y).

At the beginning of phi(1), in addition to the switches 410a-c, the switches 410e, 410f, 410g, 410h are also being operated (beginning of phi(x)), but not the switches 410i, 410k, 410l, 410m. Thus, during phi(1), capacitors 406 and 408 are connected in parallel and are both charged to a first voltage V1, while capacitors 407 and 409 are connected in parallel and are both charged to a second voltage V2, wherein the second voltage V2 has the same absolute value than the first voltage V1, but is opposite in sign.

During phi(2), the voltages V1 and V2 existing across capacitors 406, 408 and capacitors 407,409, respectively, remain constant, since all capacitors 406-409 are disconnected from the voltage sources 402, 403 and the resistances 404, 405, while the voltage sources 402 and 403 change their output voltages without any impact on the capacitors 406-409 during phi(2) being disconnected from these.

Then, at a new beginning of phi(1), in addition to the switches 410a-c, the switches 410i, 410k, 410l, 410m are also being operated (beginning of phi(y)), but not the switches 410e, 410f, 410g, 410h. Therefore, during phi(y), capacitors 406 and 409 are connected in parallel and also capacitors 407 and 408 are connected in parallel. Since the capacitors 406 and 409 (407 and 408) are oppositely charged and their net voltage is zero, the capacitors 406 and 409 (407 and 408) are completely discharged. The respective discharge paths do not go through the resistances 404, 405, but go from capacitor 406 to capacitor 409 and from capacitor 407 to capacitor 408, respectively, and are therefore very fast.

As, during phi(1), the capacitors 406 and 409 are now connected with the voltage source 402, which has changed its output voltage during the last phi(2), the capacitors 406 and 409 are charged with a third voltage V3. Similarly, as, during phi(1), the capacitors 407 and 408 are connected with the voltage source 403, which has also changed its output voltage during the last phi(2), the capacitors 407 and 408 are charged with a fourth voltage V4, wherein the voltage V4 has the same absolute value as the voltage V3, but is opposite in sign.

During phi(2), the voltages V3 and V4 existing across capacitors 406, 409 and capacitors 407, 408, respectively, remain constant, since all capacitors, 406-409 are disconnected from the voltage sources 402, 403 and the resistances 404, 405, while the voltage sources 402 and 403 change their output voltages without any impact on the capacitors 406-409 during phi(2) being disconnected from these.

Then, at a further new beginning of phi(1), in addition to the switches 410a-c, the switches 410e, 410f, 410g, 410h are also being operated (beginning of phi(x)), but not the switches 410i, 410k, 410l, 410m. Now, capacitors 406 and 408 are connected in parallel and also capacitors 407 and 409 are connected in parallel. Since capacitors 406 and 408 (407 and 409) are oppositely charged and their net voltage is zero, capacitors 406 and 408 (407 and 409) are completely discharged. At this point, a full cycle has been carried out and the process described above starts anew.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A switch capacitor circuit comprising:
   a voltage source having a first terminal and a second terminal;
   a first capacitor;
   a second capacitor;
   a third capacitor;
   a fourth capacitor;
   a first pair of switches configured to couple the first capacitor in parallel to the second capacitor, wherein one switch of the first pair of switches is configured to couple the second capacitor to the first terminal of the voltage source;
   a second pair of switches configured to couple the third capacitor in parallel to the fourth capacitor, wherein one switch of the second pair of switches is configured to couple the third capacitor to the second terminal of the voltage source;
   a third pair of switches configured to couple the first capacitor in parallel to the third capacitor, wherein one switch of the third pair of switches is configured to couple the third capacitor to the first terminal of the voltage source; and
   a fourth pair of switches configured to couple the second capacitor in parallel to the fourth capacitor, wherein one switch of the fourth pair of switches is configured to couple the second capacitor to the second terminal of the voltage source.

2. The switch capacitor circuit according to claim 1, wherein the first pair of switches and the second pair of switches are further configured to be operated during a first clock phase,
   the second pair of switches and the third pair of switches are further configured to be operated during a second clock phase, and
   the first and second clock phases are non-overlapping.

3. The switch capacitor circuit according to claim 1, wherein the first capacitor, the second capacitor, the third capacitor, and the fourth capacitor have substantially the same capacitance.

4. The switch capacitor circuit of claim 1, further comprising:
   a first switch configured to couple the one switch of the first pair of switches and the first capacitor to the first terminal of the voltage source;
   a second switch configured to couple the one switch of the second pair of switches and the fourth capacitor to the second terminal of the voltage source;
   a third switch configured to couple the first capacitor to the fourth capacitor; and
   a fourth switch configured to couple the first switch to the second switch,
   wherein the first, second, and third switches are configured to be operated during a third clock phase and the fourth switch is configured to be operated on a fourth clock phase, and
   wherein the third and fourth clock phases are non-overlapping.

5. A method for reducing an Inter-Symbol-Interference effect, comprising:
   charging a first capacitor and a second capacitor to a first voltage with at least one voltage source;
   charging a third capacitor and a fourth capacitor to a second voltage with the at least one voltage source, wherein the second voltage has substantially the same absolute value as the first voltage, but is opposite in sign;
   discharging the first capacitor through the fourth capacitor, comprising decoupling the first capacitor from the second capacitor and coupling the first capacitor in parallel to the fourth capacitor; and
   discharging the third capacitor through the second capacitor, comprising decoupling the third capacitor from the fourth capacitor and coupling the third capacitor in parallel to the second capacitor.

6. The method according to claim 5, further comprising:
   charging the first capacitor and the fourth capacitor to a third voltage with the at least one voltage source;
   charging the second capacitor and the third capacitor to a fourth voltage with the at least one voltage source, wherein the fourth voltage has substantially the same absolute value as the third voltage, but is opposite in sign;
   discharging the first capacitor through the second capacitor, comprising decoupling the first capacitor from the fourth capacitor and coupling the first capacitor in parallel to the second capacitor; and
   discharging the third capacitor through the fourth capacitor, comprising decoupling the first capacitor from the fourth capacitor and coupling the third capacitor to the fourth capacitor.

7. The method according to claim 5, wherein the first capacitor, the second capacitor, the third capacitor, and the fourth capacitor have substantially the same capacitance.

8. The method of claim 5,
   wherein the charging the first capacitor and the second capacitor comprises coupling the first capacitor in parallel to the second capacitor and coupling the at least one voltage source to the first and second capacitors, and
   wherein the charging the third capacitor and the fourth capacitor comprises coupling the third capacitor in parallel to the fourth capacitor and coupling the at least one voltage source to the third and fourth capacitors.

9. An apparatus, comprising:
   a voltage source having a first terminal and a second terminal;
   a first capacitor having a first terminal;
   a second capacitor having a first terminal;
   a third capacitor having a first terminal;
   a fourth capacitor having a first terminal;
   a first switch having a first terminal coupled to the first terminal of the voltage source and a second terminal coupled to the first terminal of the first capacitor;

a second switch having a first terminal coupled to the second terminal of the first switch and a second terminal coupled to the first terminal of the second capacitor;

a third switch having a first terminal coupled to the first terminal of the third capacitor and a second terminal coupled to the first terminal of the fourth capacitor;

a fourth switch having a first terminal coupled to the second terminal of the first switch and a second terminal coupled to the second terminal of the third switch; and a fifth switch having a first terminal coupled to the second terminal of the first switch and a second terminal coupled to the first terminal of the third switch.

10. The apparatus of claim 9, wherein the first switch is configured to be operated during a first clock phase, the second switch and the third switch are configured to be operated during a second clock phase having a frequency one half of the first clock phase, and the fourth switch and the fifth switch are configured to be operated during a third clock phase non-overlapping with the second clock phase.

* * * * *